(12) United States Patent
Lin et al.

(10) Patent No.: US 8,143,624 B2
(45) Date of Patent: Mar. 27, 2012

(54) DISPLAY DEVICE AND METHOD OF MANUFACTURING THE SAME

(75) Inventors: Han-Tu Lin, Hsin-Chu (TW);
Chien-Hung Chen, Hsin-Chu (TW);
Shiun-Chang Jan, Hsin-Chu (TW)

(73) Assignee: AU Optronics Corp. (TW)

( * ) Notice: Subject to any disclaimer, the term of this patent is extended or adjusted under 35 U.S.C. 154(b) by 55 days.

(21) Appl. No.: 12/076,297

(22) Filed: Mar. 17, 2008

(65) Prior Publication Data

US 2009/0101902 A1 Apr. 23, 2009

(30) Foreign Application Priority Data

Oct. 22, 2007 (TW) .............................. 96139549 A

(51) Int. Cl.
*H01L 27/14* (2006.01)

(52) U.S. Cl. .............................. 257/72; 357/59; 357/222

(58) Field of Classification Search .................... 257/59, 257/72, 222
See application file for complete search history.

(56) References Cited

U.S. PATENT DOCUMENTS

| | | | |
|---|---|---|---|
| 7,022,557 B2 | 4/2006 | Kim et al. | |
| 2005/0077524 A1* | 4/2005 | Ahn et al. | 257/72 |
| 2007/0170434 A1* | 7/2007 | Inoue et al. | 257/72 |
| 2007/0284586 A1* | 12/2007 | Park et al. | 257/72 |
| 2008/0158458 A1* | 7/2008 | Yang | 349/43 |
| 2008/0224238 A1* | 9/2008 | Kanakasabapathy et al. | 257/411 |

FOREIGN PATENT DOCUMENTS

| | | |
|---|---|---|
| CN | 1702530 | 11/2005 |
| TW | I281259 | 5/2007 |
| TW | I284245 | 7/2007 |

* cited by examiner

*Primary Examiner* — N Drew Richards
*Assistant Examiner* — Jae Lee
(74) *Attorney, Agent, or Firm* — Bacon & Thomas, PLLC

(57) ABSTRACT

A substrate comprising a thin-film-transistor (TFT) region, a pixel region, a gate-line region and a data-line region is provided. A transparent conductive layer and a first metal layer are orderly formed on the substrate. A conductive stack layer is formed within each of the TFT/pixel/gate-line regions and the end of the data-line region. Next, a first insulating layer and a semiconductor layer are orderly formed, and a patterned first insulating layer and a patterned semiconductor layer are formed above the conductive stack layer within the TFT region. Then, a second metal layer and a first photoresist layer are respectively formed. Afterwards, the second and the first metal layers are patterned by using the first photoresist layer as a photomask. Finally, the first photoresist layer is reflowed by heat, and part of the reflowed first photoresist layer covers a channel formed within the TFT region.

14 Claims, 11 Drawing Sheets

DISPLAY DEVICE AND METHOD OF MANUFACTURING THE SAME

This application claims the benefit of Taiwan application Serial No. 96139549, filed Oct. 22, 2007, the subject matter of which is incorporated herein by reference.

BACKGROUND OF THE INVENTION

1. Field of the Invention

The invention relates in general to a display device and manufacturing method thereof, and more particularly to a display device capable of decreasing the number of photomasks required in the manufacturing processes and a method of manufacturing the display device thereof.

2. Description of the Related Art

Conventional manufacturing process of thin-film-transistor (TFT) display normally employs five or four photomask processes to form a gate (a first metal layer), a semiconductor layer, a source/drain (a second metal layer), a protection layer and a transparent electrode such as an indium tin oxide (ITO). To further simplify the manufacturing process and reduce the manufacturing cost, the manufacturers aim to achieve the same TFT effect by using less photomasks.

As the panel size of the display device becomes larger and larger, the signal delay occurring to electrode wire due to impedance also becomes worse and worse, especially the signal delay in the gate signal line is even worse. Therefore, how to reduce the resistance of the conductive wire has become an imminent issue to be resolved to manufacturers of large-sized panels.

SUMMARY OF THE INVENTION

The invention is directed to a display device and a manufacturing method thereof. The method of present invention decreases the number of photomasks and the resistance of conductive wires, not only reducing manufacturing cost but also increasing signal transmission speed of the display device.

According to a first aspect of the present invention, a method of manufacturing a display device is disclosed. A substrate having a thin-film-transistor (TFT) region, a pixel region, a gate-line region and a data-line region is provided. A transparent conductive layer and a first metal layer are orderly formed on the substrate. A conductive stack layer comprising the transparent conductive layer and the first metal layer is then formed within each of the TFT/pixel/gate-line regions and the end of the data-line region by patterning procedure. Next, a first insulating layer and a semiconductor layer are orderly formed above the substrate to cover the conductive stack layer, and a patterned first insulating layer and a patterned semiconductor layer are formed above the conductive stack layer within the TFT region by patterning procedure. Then, a second metal layer is formed above the substrate to cover the patterned semiconductor layer and the conductive stack layer, and a first photoresist layer is formed on the second metal layer. After that, the second metal layer and the first metal layer are patterned using the first photoresist layer as photomask, and a channel is formed within the TFT region. Finally, the first photoresist layer is reflowed by heat, and part of the reflowed first photoresist layer covers the channel for protection.

According to a second aspect of the present invention, a display device comprising a substrate, a conductive stack layer, a patterned first insulating layer, a patterned semiconductor layer, a patterned second metal layer and a photoresist layer is disclosed. The substrate comprises a TFT region, a pixel region, a capacitor region, a gate-line region and a data-line region. The conductive stack layer disposed within the TFT/capacitor/gate-line regions of the substrate comprises a transparent conductive layer and a first metal layer, wherein the transparent conductive layer is within the pixel region. The patterned first insulating layer is disposed within the TFT region of the substrate and the conductive stack layer within the capacitor region. The patterned semiconductor layer is disposed above the patterned first insulating layer within the TFT region of the substrate. The patterned second metal layer comprises a source/drain pattern, a second metal capacitor pattern, a gate circuit pattern and a data line, wherein the source/drain pattern is disposed above the patterned semiconductor layer within the TFT region, the second metal capacitor pattern is disposed above the patterned first insulating layer within the capacitor region, and the gate circuit pattern is disposed above the conductive stack layer within the gate-line region. The conductive stack layer and the gate circuit pattern form a gate line, and the data line disposed within the data-line region is electrically connected to the source pattern. In the step of patterning the second metal layer, part of the transparent conductive layer within the pixel region is exposed as a pixel electrode. The photoresist layer covering the patterned second metal layer is an organic material.

The invention will become apparent from the following detailed description of the preferred but non-limiting embodiments. The following description is made with reference to the accompanying drawings.

DETAILED DESCRIPTION OF THE INVENTION

A display device and a manufacturing method thereof are disclosed in the present invention. The method is applicable to manufacture a thin-film-transistor (TFT) display device having different TFT structures such as back channel etching (BCE) TFT or etch stop type TFT. Moreover, the manufacturing method of the invention reduces the number of photomasks, hence decreasing the manufacturing cost. In addition, the electrode wire manufactured according to the invention (such as the gate signal line which comprises three layers of conductive structures) is capable of reducing the impedance in conductive wire, hence resolving the signal delay problem occurring to conventional large-sized panel electrode wire when impedance is too high.

A first embodiment, a second embodiment, and a third embodiment are respectively disclosed below for elaborating the present invention. The TFTs used in the display device of the first embodiment and the second embodiment are exemplified by back channel etching (BCE) structure, and the TFT used in the display device of the third embodiment is exemplified by etch stop type (I-Stop) structure. However, the embodiments disclosed herein are used for illustrating the present invention, but not for limiting the scope of the present invention. Moreover, the drawings used for illustrating the embodiment and applications of the present invention only show the major characteristic parts to avoid obscuring the invention. Furthermore, the same element illustrated in the first, second and third embodiments are designated with the same reference numbers.

First Embodiment

Figure 1A:
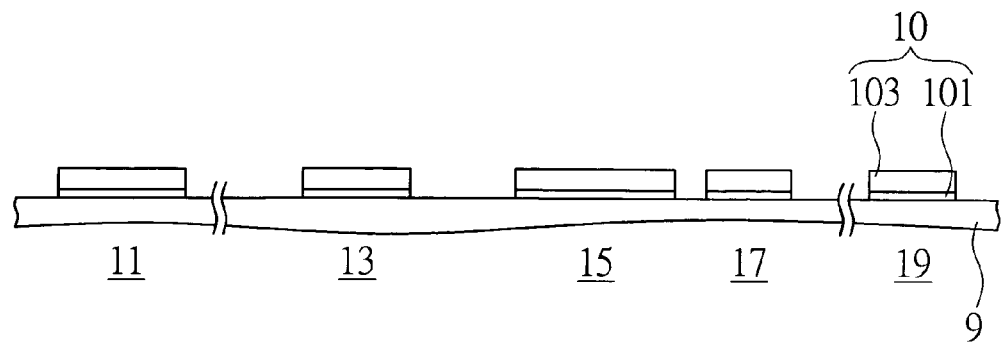
FIGS. 1A~1F illustrate a method of manufacturing a display device according to a first embodiment of the present invention.
Figure 1B:
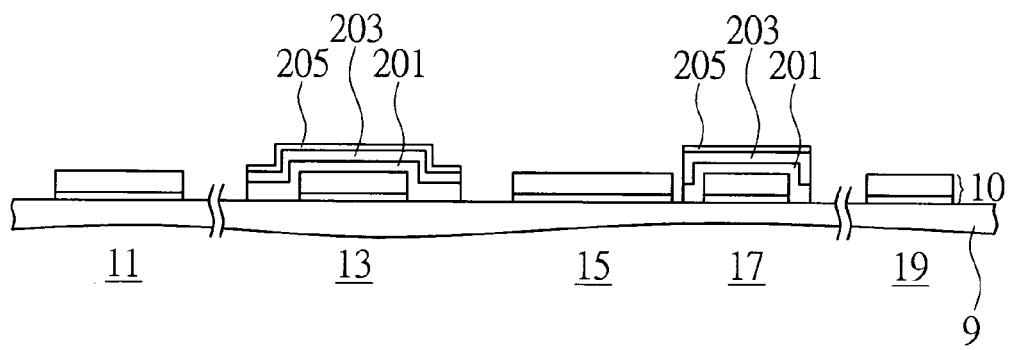
Figure 1C:
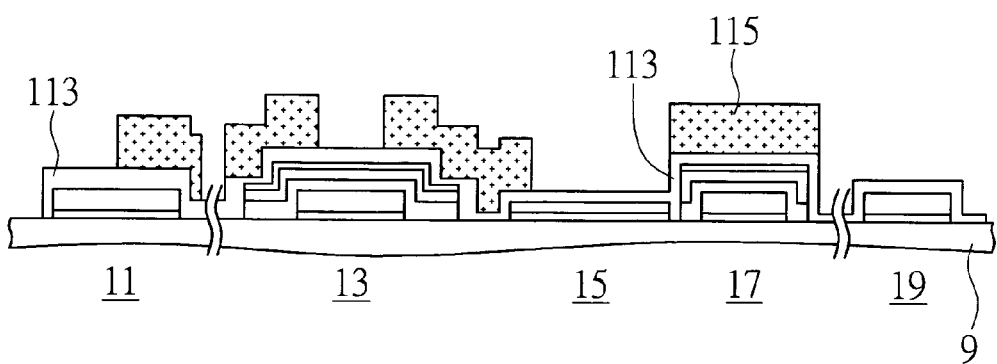
Figure 1D:
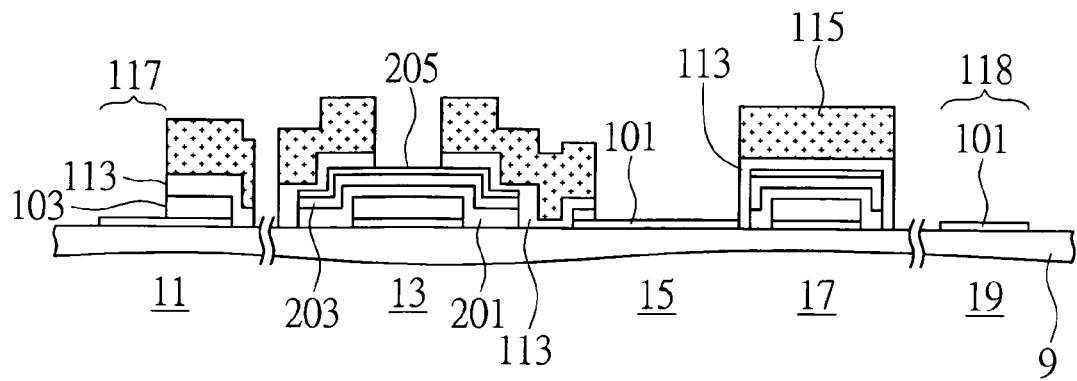
Figure 1E:
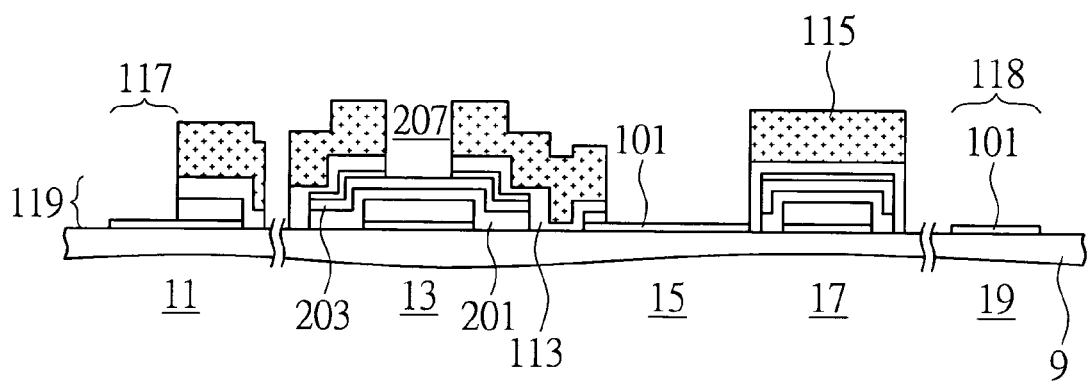
Figure 1F:
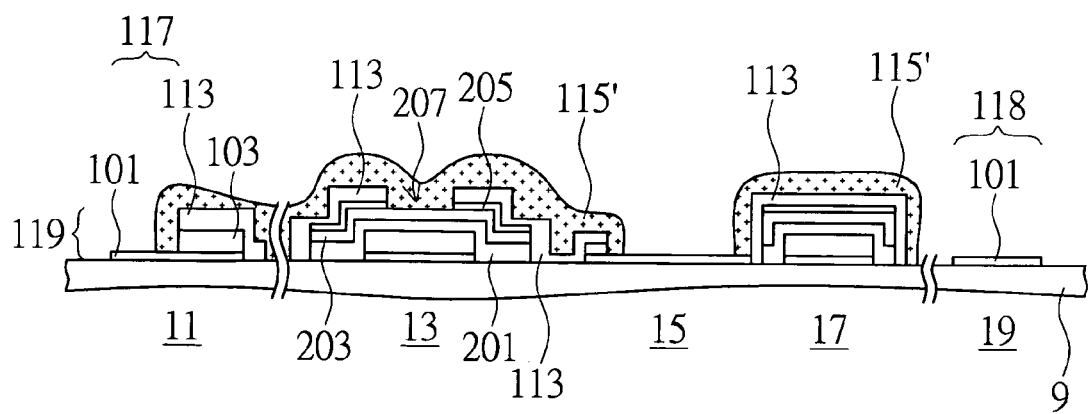
Figure 2A:
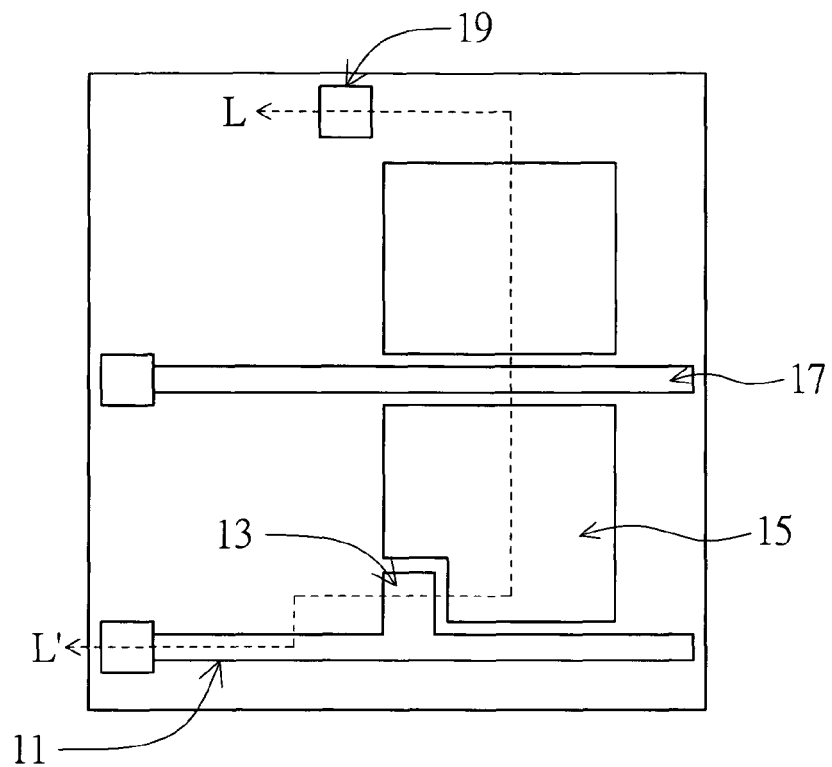
FIGS. 2A~2C respectively are the top views of FIGS. 1A, 1B and 1F.
Figure 2B:
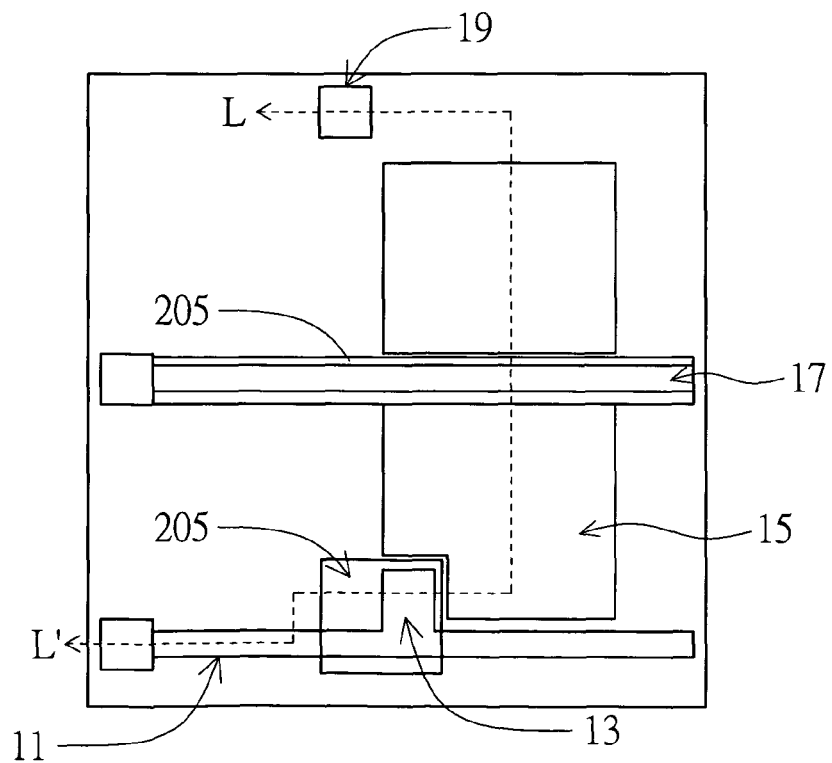
Figure 2C:
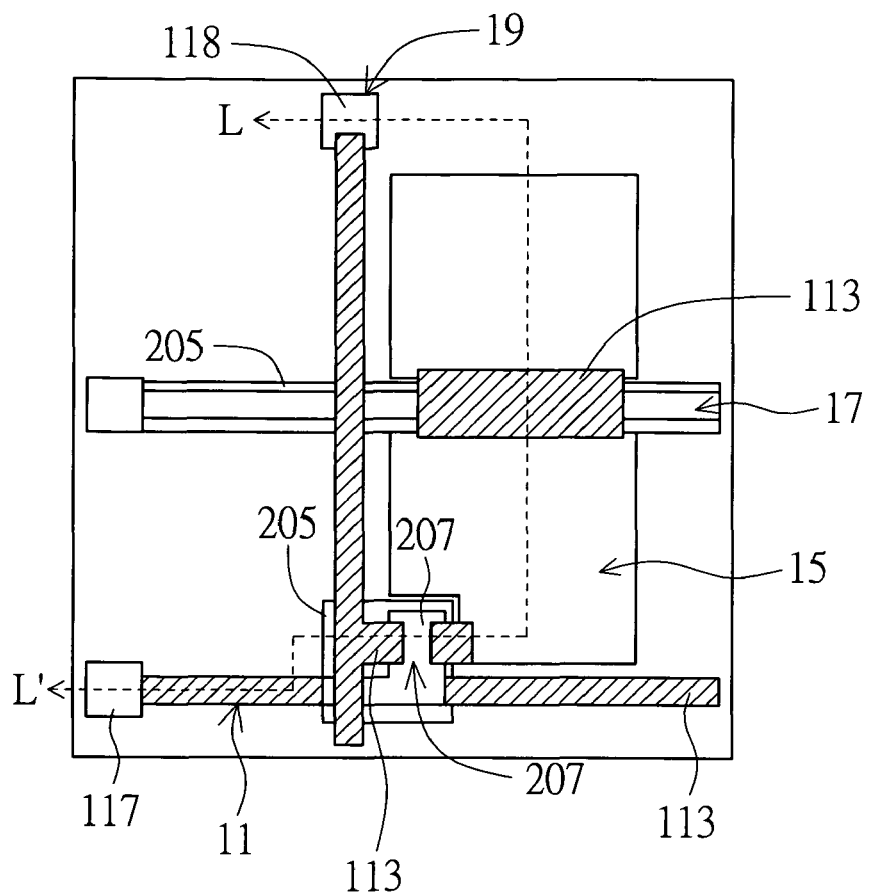

Referring to FIGS. 1A~1F, diagrams illustrating a method of manufacturing a display device according to a first embodiment of the present invention are shown. Referring to FIGS. 2A~2C, top views of FIGS. 1A, 1B and 1F are shown. FIGS. 1A, 1B and 1F are cross-sectional view along the cross-sectional line L-L' of FIGS. 2A~2C.

The display device comprises a plurality of scan signal lines (not illustrated) and a plurality of data signal lines (not illustrated), wherein the scan signal lines and the data signal lines are criss-crossed in a matrix form, a plurality of pixels are defined by the scan signal lines and the data signal lines, and each pixel is defined by a pair of neighboring scan signal lines and a pair of neighboring data signal lines. To elaborate the manufacturing method of the present embodiment, each pixel comprises a gate-line region 11, a TFT region 13, a pixel region 15, a capacitor region 17 and a data-line region 19.

The First Photomask Process

Referring to both FIG. 1A and FIG. 2A. FIG. 1A is a cross-sectional view along the cross-sectional line L-L' of FIG. 2A. Firstly, a substrate 9 is provided, a transparent conductive layer 101 is formed on the substrate 9, and then a first metal layer 103 is formed above the transparent conductive layer 101. Then, a first metal layer 103 and a transparent conductive layer 101 are patterned (by micro-filming and etching process) to form a conductive stack layer 10 within each of the TFT region 13, the pixel region 15, the gate-line region 11 and the end of the data-line region 19 (the squared regions as indicated in FIG. 2A). The transparent conductive layer 101 could be made of indium tin oxide (ITO).

Moreover, in the present embodiment, a capacitor conductive stack layer 10 is concurrently formed within the capacitor region 17 when patterning the transparent conductive layer 101 and the first metal layer 103, wherein the capacitor conductive stack layer 10 also comprises the transparent conductive layer 101 and the first metal layer 103.

The Second Photomask Process

Referring to both FIGS. 1B and 2B. FIG. 1B is a cross-sectional view along the cross-sectional line L-L' of FIG. 2B. In the second photomask process, the first insulating layer and the semiconductor layer are orderly formed above the substrate 9 to cover the conductive stack layer 10. Then, the first insulating layer and the semiconductor layer are patterned (by micro-filming and etching process) to form a patterned first insulating layer 201 and a patterned semiconductor layer 203 above the conductive stack layer 10 within the TFT region 13. The patterned first insulating layer 201 and the patterned semiconductor layer 203 are formed in the same photomask process.

Moreover, in the present embodiment, the patterned first insulating layer 201 and the patterned semiconductor layer 203 are concurrently formed above the capacitor conductive stack layer 10 within the capacitor region 17 when patterning the first insulating layer and the semiconductor layer, as indicated in FIG. 1B.

Preferably, an Ohmic contact layer is formed above the semiconductor layer, and a patterned Ohm contact layer 205 is respectively formed within the TFT region 13 and the capacitor region 17 by the same photomask process in the step of patterning the first insulating layer and the semiconductor layer.

In the present embodiment, the patterned first insulating layer 201, the patterned semiconductor layer 203 and the patterned Ohmic contact layer 205 are respectively made from a silicon nitride (SiN) layer, an amorphous silicon (a-Si) layer and a $n^+$ a-Si layer.

The Third Photomask Process

Then, a second metal layer 113 is formed above the substrate 9 to cover the patterned semiconductor layer 203 (cover the patterned Ohm contact layer 205 as illustrated in the present embodiment) within the TFT region 13 and the capacitor region 17, and also cover the conductive stack layer 10 within the gate-line region 11, the pixel region 15 and the data-line region 19. After that, a patterned first photoresist layer 115 is formed above the second metal layer 113 as indicated in FIG. 1C. The first photoresist layer 115 is an organic material which is etching resistant and capable of reflowing under high temperature.

As shown in FIG. 1D, after the second metal layer 113 and the first metal layer 103 are patterned using the patterned first photoresist layer 115 as a photomask, the structure details are described as follows: (a) part of the surface of the patterned Ohmic contact layer 205 is exposed within the TFT region 13; (b) part of the transparent conductive layer 101 is exposed within the pixel region 15 as a pixel electrode; (c) part of the transparent conductive layer 101 is respectively exposed at the ends of the gate-line region 11 and the data-line region 19 as a gate pad 117 and a data pad 118; and (d) a second metal capacitor pattern 113 is formed above the patterned semiconductor layer 203 (the second metal capacitor pattern 113 is above the patterned Ohmic contact layer 205 in the present embodiment) within the capacitor region 17.

Then, as shown in FIG. 1E, part of the patterned Ohmic contact layer 205 is removed from the TFT region 13 to expose part of the surface of the patterned semiconductor layer 203 to form a channel 207.

Finally, the first photoresist layer 115 is reflowed by heat, and part of the melted first photoresist layer 115 covers the channel 207 within the TFT region 13 as indicated in FIG. 1F. In addition to covering the channel 207 and the second metal layer 113 within the TFT region 13, part of the reflowed photoresist layer 115' covers part of the surface of the transparent conductive layer 101 within the pixel region 15 and the gate-line region 11 and covers the second metal capacitor pattern 113 within the capacitor region 17. Therefore, the reflowed photoresist layer 115' completely covers the second metal layer 113 for protection.

Referring to FIG. 2C, a top view of FIG. 1F is shown. As indicated in FIG. 2C, there are a second metal layer 113 formed on the gate line within the gate-line region 11 and a gate pad 117 (formed by the transparent conductive layer 101) formed in the end of the gate-line region 11. As shown in FIG. 2C, the channel 207 and the second metal layer 113 is presented within the TFT region 13, and the second metal capacitor pattern 113 is also presented within the capacitor region 17. There is a data pad 118 (formed by the transparent conductive layer 101) in the end of the data-line region 19.

In the gate-line region 11 of the first embodiment, the transparent conductive layer 101 is used as a gate pad 117, and the gate line is a conductive stack layer 119 (as indicated in FIG. 1E) comprising three layers including the transparent conductive layer 101, the first metal layer 103 and the second metal layer 113.

According to the descriptions above, the reflowed photoresist 115' functions as a protection layer for the display device, and it is no need to proceed the subsequent step of forming a protection layer and the number of photomasks can be reduced. Moreover, the gate line within the gate-line region 11 is a conductive stack layer 119 comprising three laminated conductive layers, and is capable of reducing the impedance in conductive wire, hence resolving the signal delay problem occurring to conventional large-sized panel electrode wire when impedance is too high.

Second Embodiment

The capacitor structure of the second embodiment is different from that of the first embodiment. As part of the manufacturing process in the method of manufacturing display device according to the second embodiment is similar to that according to the first embodiment, the similarities are referred to FIGS. 1A~1F and related elaboration and are not repeated here.

Figure 3:
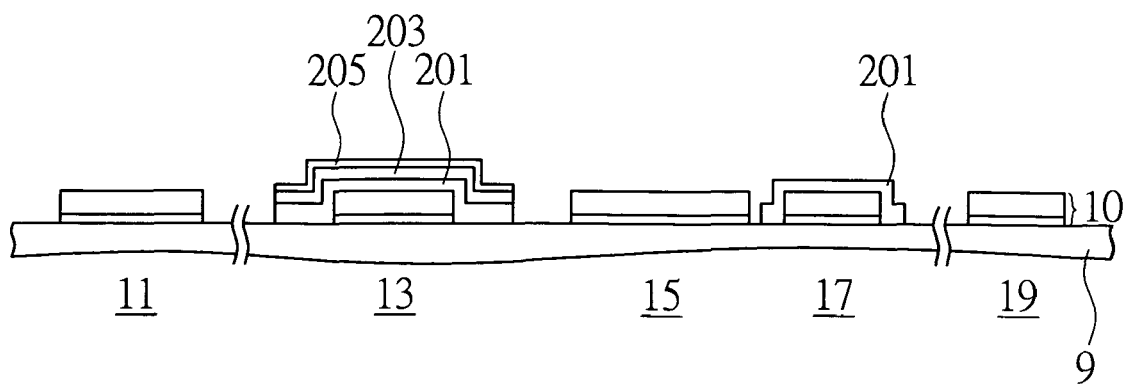
FIG. 3 is one step of a method of manufacturing a display device according to a second embodiment of the present invention.
Figure 4:
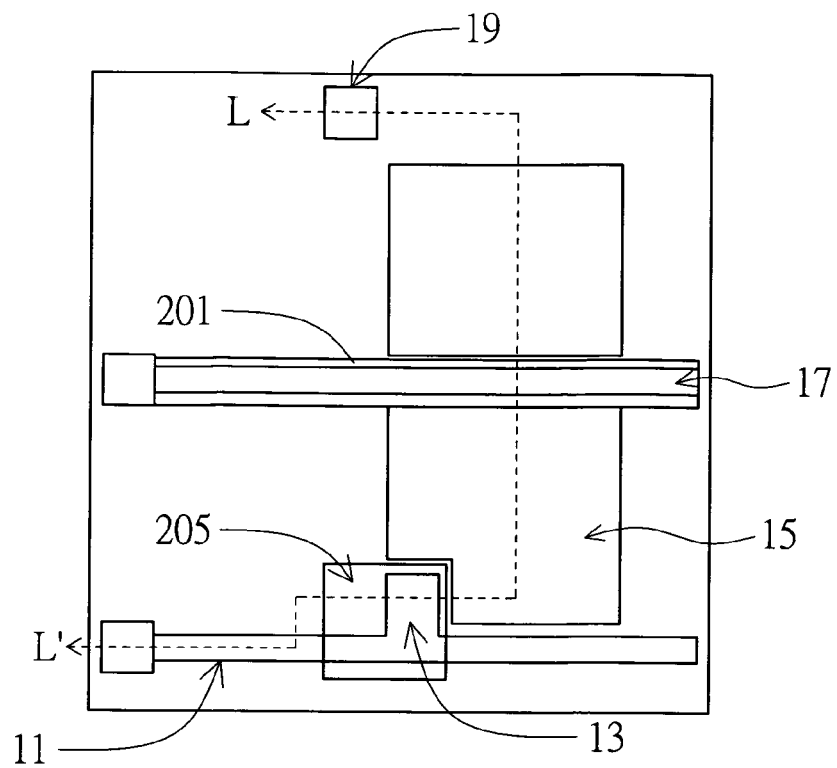
FIG. 4 is a top view of FIG. 3.

Referring to FIG. 3, one step of a method of manufacturing a display device according to a second embodiment of the present invention is shown. In the second embodiment, the conductive stack layer 10 is formed within each of the TFT region 13, the pixel region 15, the capacitor region 17, the gate-line region 11 and the end of the data-line region 19 as indicated in FIG. 1A. Then, a patterned first insulating layer 201 and a patterned semiconductor layer 203 (and a patterned Ohm contact layer 205) are formed within the TFT region 13, and a patterned first insulating layer 201 is concurrently formed on the capacitor conductive stack layer 10 within the capacitor region 17. Also, referring to FIG. 4, a top view of FIG. 3 is shown.

In the present embodiment, the patterned first insulating layer 201, the patterned semiconductor layer 203 and the patterned Ohmic contact layer 205 are respectively made from a silicon nitride (SiN) layer, an a-Si layer and a n$^+$ a-Si layer.

In the second embodiment, the patterned first insulating layer 201 and the semiconductor layer 203 could be formed by a half-tone photomask process, a gray-tone photomask process, or formed by a process using two photomasks with different intensities of exposure. There is no specific restriction imposed here.

Similar to the first embodiment, the reflowed photoresist can be functioned as a protection layer for the display device in the structure manufactured according to the second embodiment, hence reducing the number of photomasks. The gate line formed by three conductive layers is capable of reducing the impedance in conductive wire, hence resolving the signal delay problem occurring to conventional large-sized panel electrode wire when impedance is too high. Unlike the first embodiment, the capacitor structure manufactured according to the second embodiment merely comprises the patterned first insulating layer 201 (such as silicon nitride) and does not include amorphous silicon, hence having a stable capacitance when voltage volume changes.

Figure 5A:
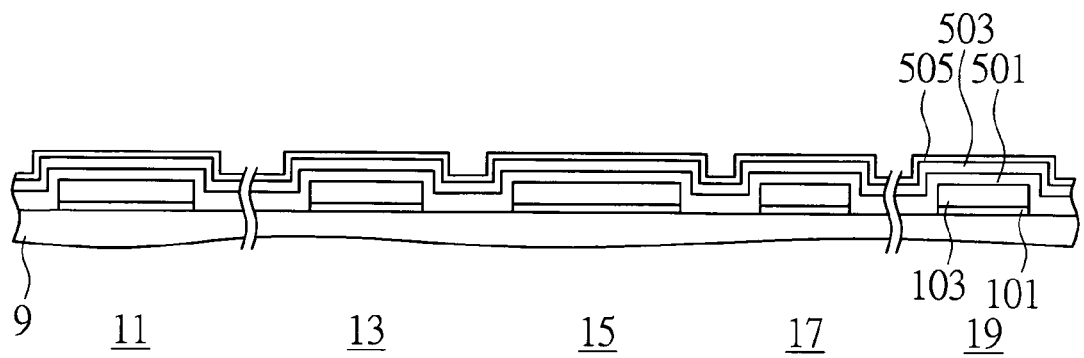
FIGS. 5A~5E illustrate a method of forming the structure within the TFT region and the capacitor region of FIG. 3 according to the second embodiment of the present invention.
Figure 5B:
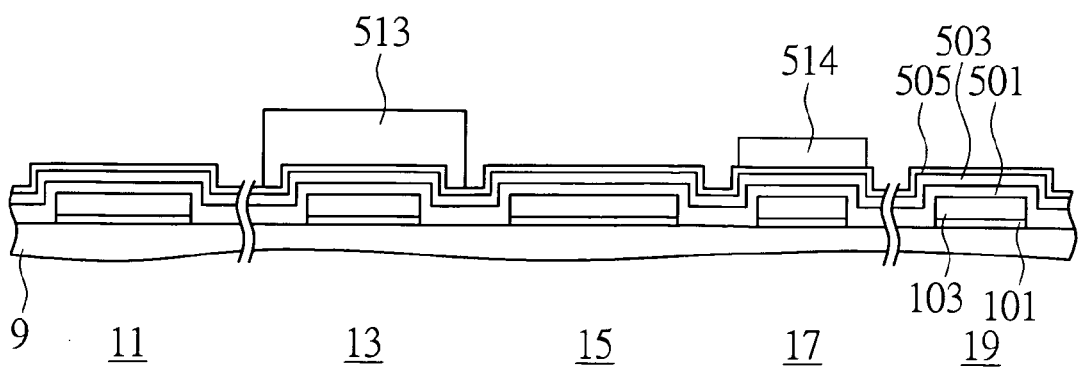
Figure 5C:
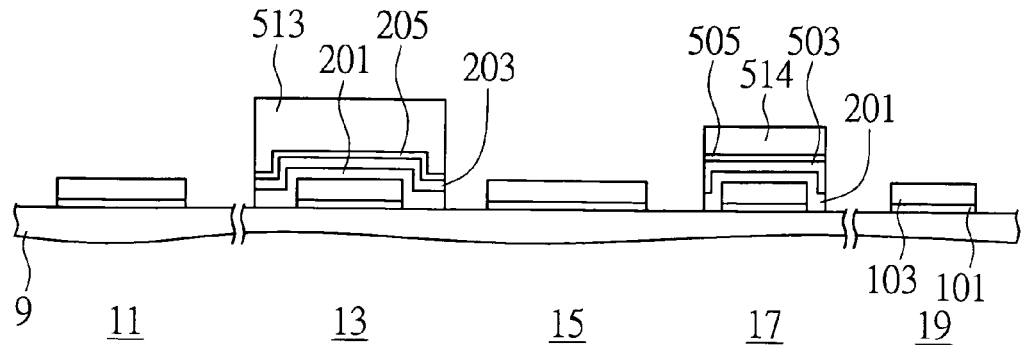
Figure 5D:
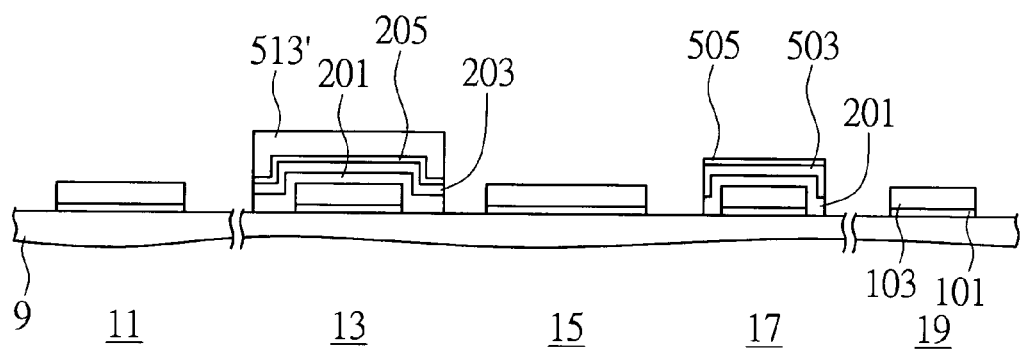
Figure 5E:
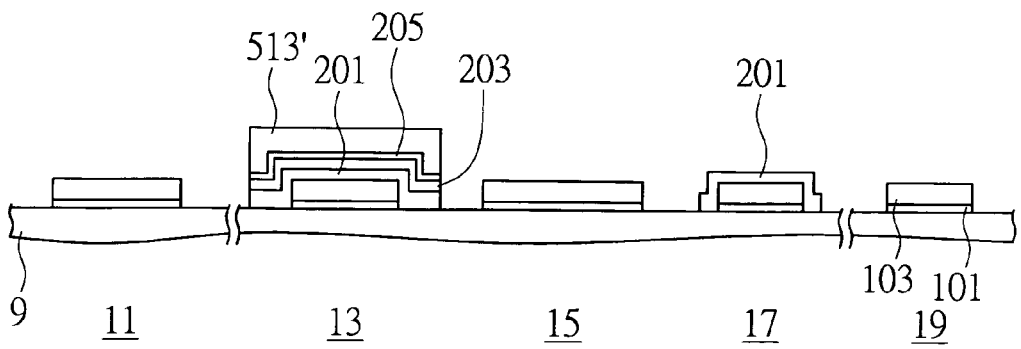

Furthermore, in the second embodiment, the structure within the TFT region and the capacitor region of FIG. 3 can be formed according to the manufacturing method as indicated in FIG. 5A~FIG. 5E. As indicated in FIG. 5A, a first insulating layer 501, a semiconductor layer 503, and an Ohmic contact layer 505 are orderly formed above the substrate to cover the conductive stack layers (formed by the transparent conductive layer 101 and the first metal layer 103). Then, as indicated in FIG. 5B, a photoresist layer is respectively formed on the Ohmic contact layer 505 within the TFT region 13 and the capacitor region 17, wherein the photoresist is formed on the semiconductor layer 503 if the Ohmic contact layer 505 is omitted in the manufacturing process, the photoresist layer comprises a photoresist block 513 disposed within the TFT region 13 and a photoresist block 514 disposed within the capacitor region 17, and the thickness of the photoresist block 513 is larger than that of the photoresist block 514. After that, the photoresist layer is used as a photomask, and a first etching process is applied to the Ohmic contact layer 505, the semiconductor layer 503 and the first insulating layer 501 to form the patterned first insulating layer 301 as indicated in FIG. 5C. Meanwhile, the patterned first insulating layer 201 within the TFT region 13 and the capacitor region 17 is identical to the pattern of FIG. 3. Then, the photoresist layer is thinned by ashing process until the photoresist block 514 within the capacitor region 17 is completely removed as indicated in FIG. 5D. Afterwards, the remaining photoresist block 513' within the TFT region 13 is used as photomask, and a second etching process is applied to the semiconductor layer 503 within the capacitor region 17 to form a patterned semiconductor layer 201 as indicated in FIG. 5E. Meanwhile, the Ohmic contact layer 505 and the semiconductor layer 503 within the capacitor region 17 are completely removed. Finally, the remaining photoresist block 513' is removed, and the structure within the TFT region and the capacitor region as indicated in FIG. 3 is completed. However, anyone who is skilled in the technology of the present invention will understand that the manufacturing method disclosed in FIG. 5A~FIG. 5E is only an example of one of the manufacturing processes according to the second embodiment, and those illustration disclosed herein is used for exemplify not limit the present invention. Other methods capable of manufacturing the structure within the TFT region and the capacitor region as indicated in FIG. 3 are also applicable to the second embodiment.

Third Embodiment

In the first embodiment and the second embodiment, the TFT structure of the display device is exemplified by back channel etching (BCE) TFT, but in the third embodiment, the TFT structure of the display device is exemplified by etch stop type (I-Stop) TFT.

Figure 6A:
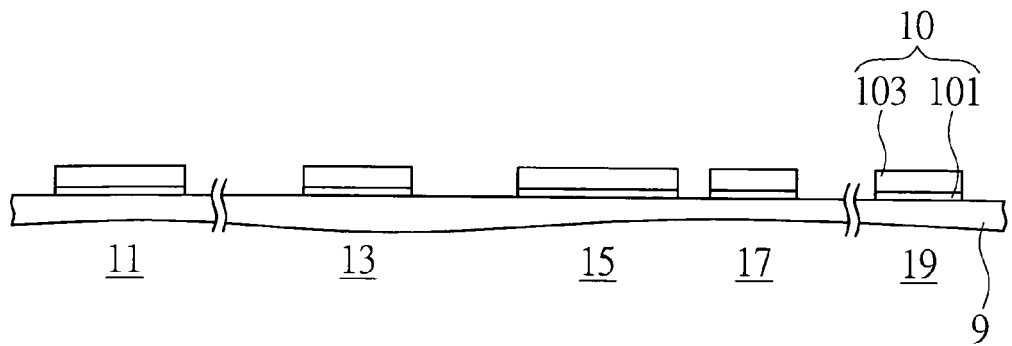
FIGS. 6A~6G illustrate a method of manufacturing a display device according to a third embodiment of the present invention.
Figure 6B:
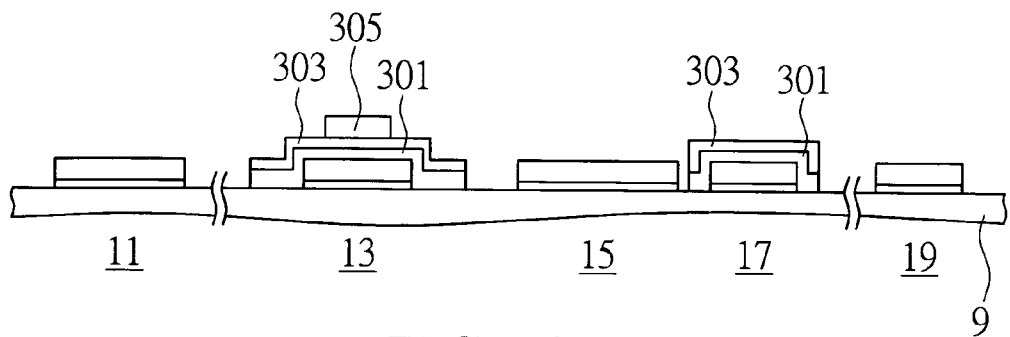
Figure 6C:
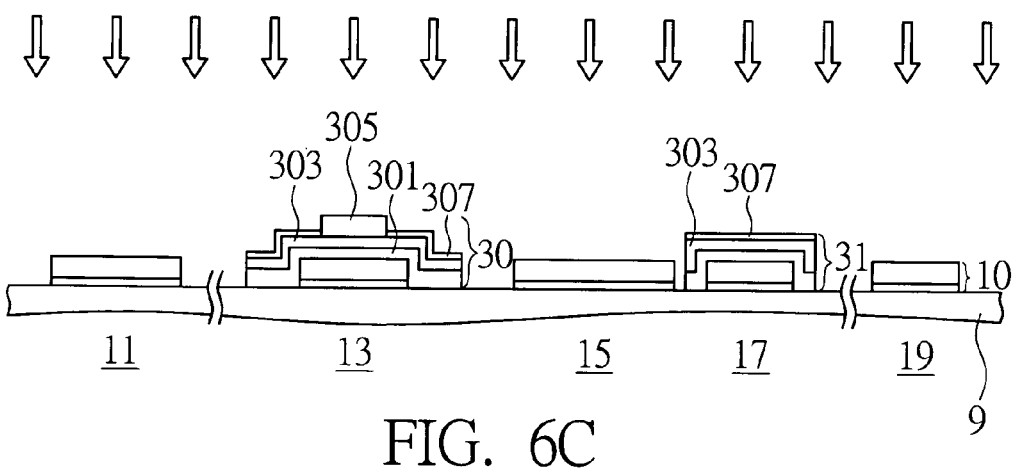
Figure 6D:
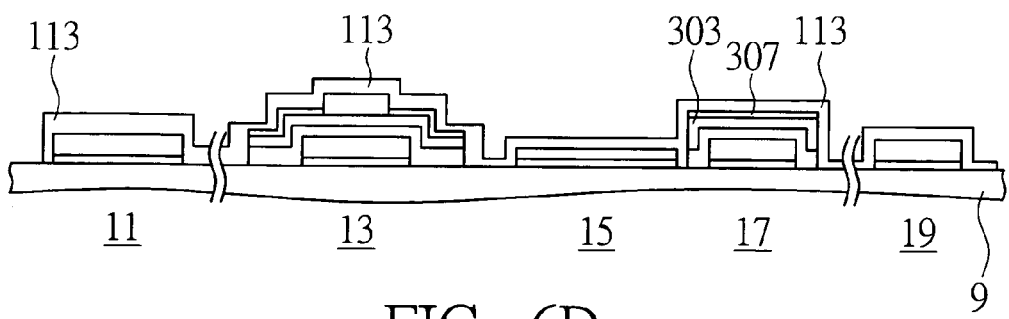
Figure 6E:
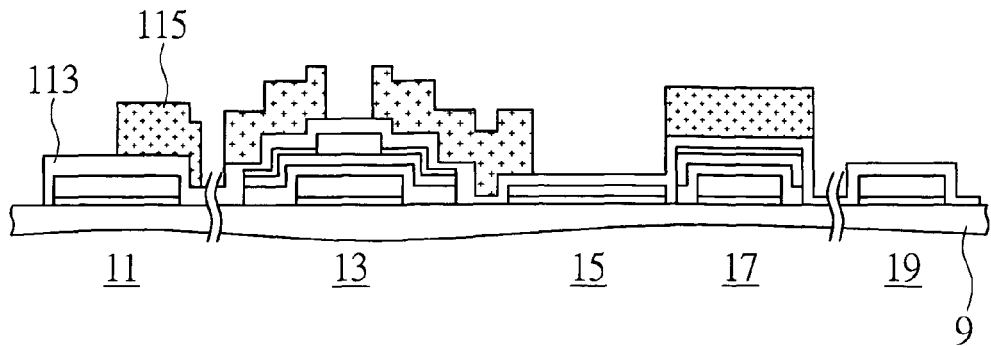
Figure 6F:
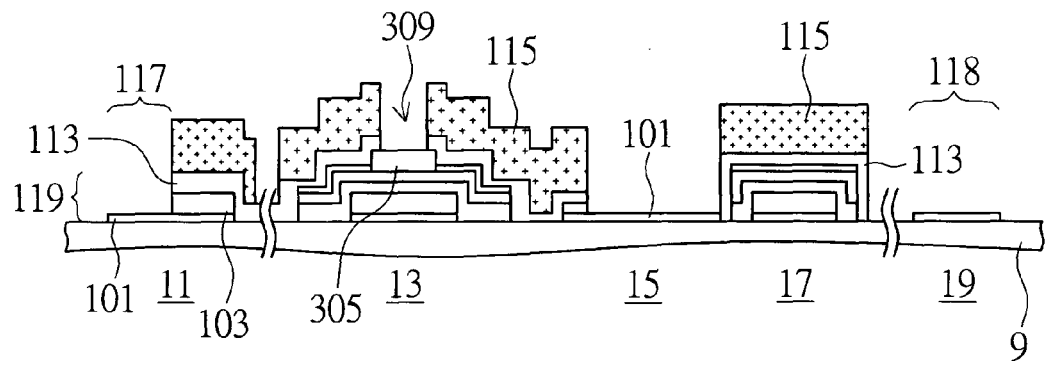
Figure 6G:
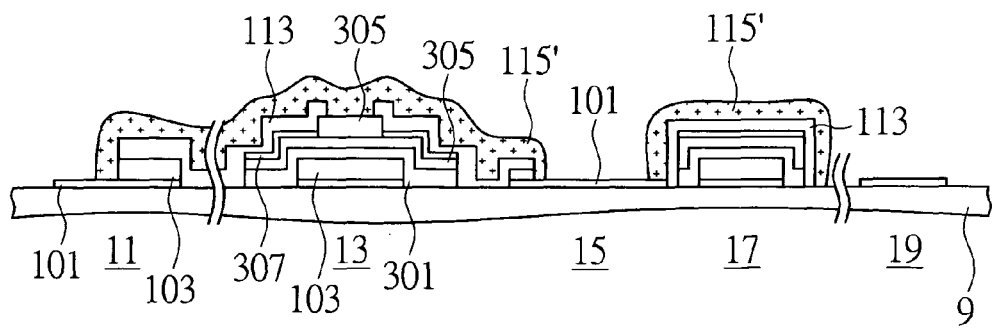

Referring to FIG. 6A~FIG. 6G, diagrams illustrating a method of manufacturing a display device according to a third embodiment of the present invention are shown. Also, referring to FIGS. 7A~7C, respective top views of FIG. 6A, FIG. 6B and FIG. 6G are shown. FIG. 6A, FIG. 6B and FIG. 6G are cross-sectional views along the cross-sectional lines L-L' of FIG. 7A~FIG. 7C.

The display device comprises a plurality of scan signal lines (not illustrated) and a plurality of data signal lines (not illustrated), wherein the scan signal lines and the data signal lines are criss-crossed in a matrix form, a plurality of pixels are defined by the scan signal lines and the data signal lines, and each pixel is defined by a pair of neighboring scan signal lines and a pair of neighboring data signal lines. To elaborate the manufacturing method of the present embodiment, each pixel comprises a gate-line region 11, a TFT region 13, a pixel region 15, a capacitor region 17 and a data-line region 19.

Figure 7A:
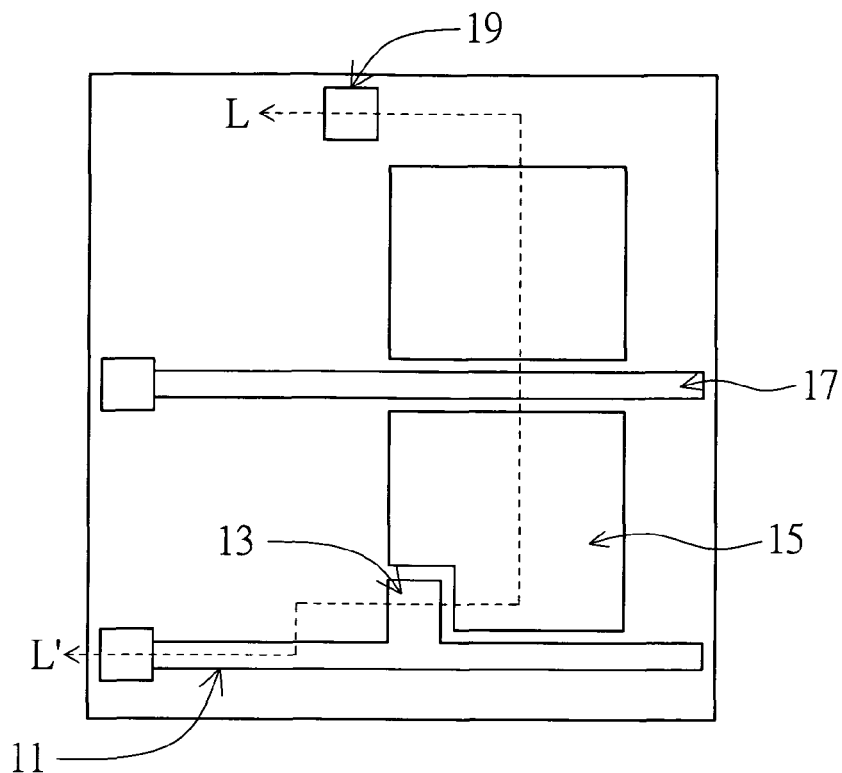
FIGS. 7A~7C respectively are top views of FIGS. 6A, 6B and 6G.

The First Photomask Process:

Referring to both FIG. 6A and FIG. 7A. FIG. 6A is cross-sectional view along the cross-sectional line L-L' of FIG. 7A. Firstly, a substrate 9 is provided, a transparent conductive layer 101 is formed on the substrate 9, and then a first metal layer 103 is formed above the transparent conductive layer 101. Then, a first metal layer 103 and a transparent conductive layer 101 are patterned (by micro-filming and etching process) such that a conductive stack layer 10 is formed within each of the TFT region 13, the pixel region 15, the gate-line region 11 and the end of the data-line region 19 (the squared regions as indicated in FIG. 7A). The transparent conductive layer 101 could be made of indium tin oxide (ITO).

Moreover, in the present embodiment, a capacitor conductive stack layer 10 is concurrently formed within the capacitor region 17 when patterning the transparent conductive layer 101 and the first metal layer 103, wherein the capacitor conductive stack layer 10 also comprises the transparent conductive layer 101 and the first metal layer 103.

Figure 7B:
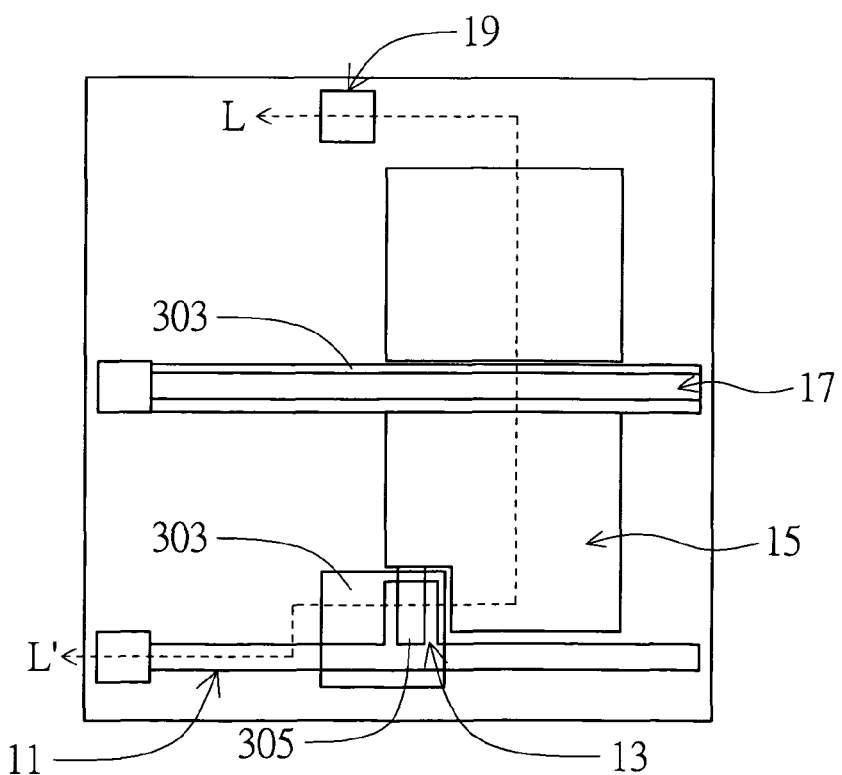

The Second Photomask Process:

Referring to both FIGS. 6B and 7B. FIG. 6B is a cross-sectional view along the cross-sectional line L-L' of FIG. 7B. In the second photomask process, the first insulating layer, the semiconductor layer and the second insulating layer are orderly formed above the substrate 9 to cover the conductive stack layer 10. Then, patterning process (by micro-filming and etching process) is applied to form a patterned first insulating layer 301, a patterned semiconductor layer 303 and a patterned second insulating layer 305 above the conductive stack layer 10 within the TFT region 13 by a half-tone photomask process, a gray-tone photomask process or a process using two photomasks with different intensities of exposure.

Moreover, in the present embodiment, the patterned first insulating layer 301 and the patterned semiconductor layer 303 are concurrently formed above the capacitor conductive stack layer 10 within the capacitor region 17 during the second photomask process of patterning the first insulating layer and the semiconductor layer as indicated in FIG. 6B.

In the present embodiment, the patterned first insulating layer 301, the patterned semiconductor layer 303 and the patterned second insulating layer 305 could be respectively made from a silicon nitride (SiN) layer, an a-Si layer and a silicon nitride layer.

Preferably, the TFT region 13 and the capacitor region 17 are subjected to a $PH_3$ treatment to form a patterned Ohmic contact layer 307 above the patterned semiconductor layer 303, as shown in FIG. 6C. Examples of the patterned Ohmic contact layer 307 include an $n^+$ a-Si layer.

The Third Photomask Process:

Then, as indicated in FIG. 6D, a second metal layer 113 is formed above the substrate 9 to cover the conductive stack layer 10 within the gate-line region 11, the pixel region 15 and the data-line region 19, cover the patterned second insulating layer 305 and the patterned Ohm contact layer 307 within the TFT region 13, and cover the patterned Ohmic contact layer 307 within the capacitor region 17. After that, a patterned first photoresist layer 115 is formed above the second metal layer 113 as indicated in FIG. 6E. The first photoresist layer 115 is an organic material which is etching resistant and capable of reflowing under high temperature.

Then, as indicated in FIG. 6F, the patterned first photoresist layer 115 is used as a photomask (by micro-filming and etching process) to pattern the second metal layer 113 and the first metal layer 103. After patterning, a separation region 309 is formed within the TFT region 13.

As indicated in FIG. 6F, after the second metal layer 113 and the first metal layer 103 are patterned using the patterned first photoresist layer 115 as a photomask, the structure details are described as follows: (a) part of the surface of the patterned Ohmic contact layer 305 is exposed within the TFT region 13; (b) part of the transparent conductive layer 101 is exposed within the pixel region 15 as a pixel electrode; (c) part of the transparent conductive layer 101 is respectively exposed at the ends of the gate-line region 11 and the data-line region 19 as a gate pad 117 and a data pad 118; and (d) a second metal capacitor pattern 113 is formed above the patterned semiconductor layer 303 (the second metal capacitor pattern 113 is positioned above the patterned Ohmic contact layer 307 in the present embodiment) within the capacitor region 17.

Finally, the first photoresist layer 115 is reflowed by heat, and part of the first photoresist layer 115 flows into a separation region 309 within the TFT region 13 as indicated in FIG. 6G. In addition to covering the separation region 309 and the second metal layer 113 within the TFT region 13, part of the reflowed photoresist layer 115' also covers part of the surface of the transparent conductive layer 101 within the pixel region 15 and the gate-line region 11 and covers the second metal capacitor pattern 113 within the capacitor region 17. Therefore, the reflowed photoresist layer 115' completely covers the second metal layer 113 for protection.

Figure 7C:
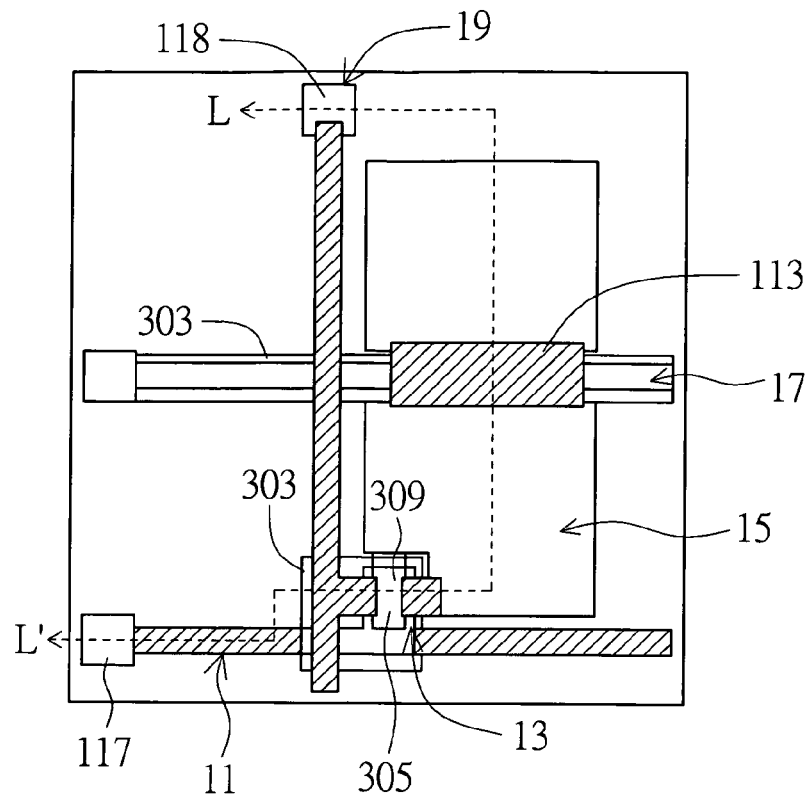

Referring to FIG. 7C, a top view of FIG. 6G is shown. As indicated in FIG. 7C, there are a second metal layer 113 formed on the gate line within the gate-line region 11 and a gate pad 117 (formed by the transparent conductive layer 101) formed in the end of the gate-line region 11. As shown in FIG. 7C, the separation region 309 and the second metal layer 113 is presented within the TFT region 13, and the second metal capacitor pattern 113 is also presented within the capacitor region 17. There is a data pad 118 (formed by the transparent conductive layer 101) in the end of the data-line region 19.

According to the third embodiment, the reflowed photoresist 115' can be functioned as a protection layer for the display device, so that there is no need to proceed the subsequent step of forming a protection layer and the number of photomasks is decreased. Moreover, the gate line within the gate-line region 11 is a conductive stack layer 119 with three conductive layers including a transparent conductive layer 101, a first metal layer 103 and a second metal layer 113 (as indicated in FIG. 6F), and is capable of reducing the impedance in conductive wire to resolve the signal delay problem of the conventional large-sized panel.

Figure 8A:
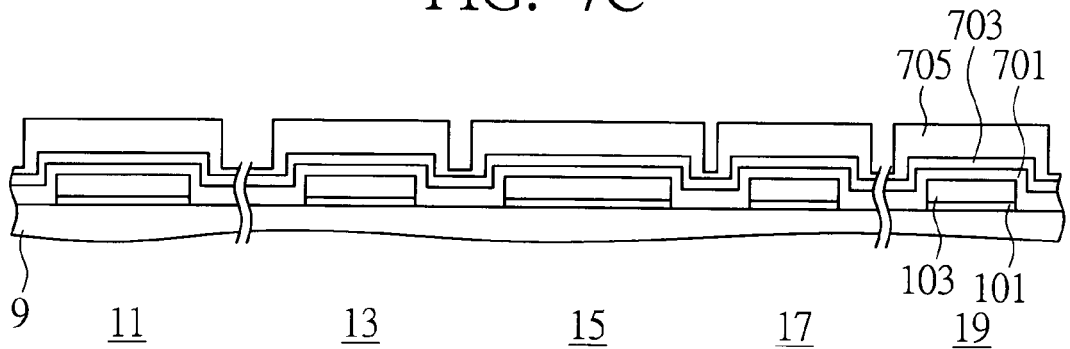
FIGS. 8A~8E illustrate a method of forming structure within the TFT region and the capacitor region of FIG. 6B according to the third embodiment of the present invention.
Figure 8B:
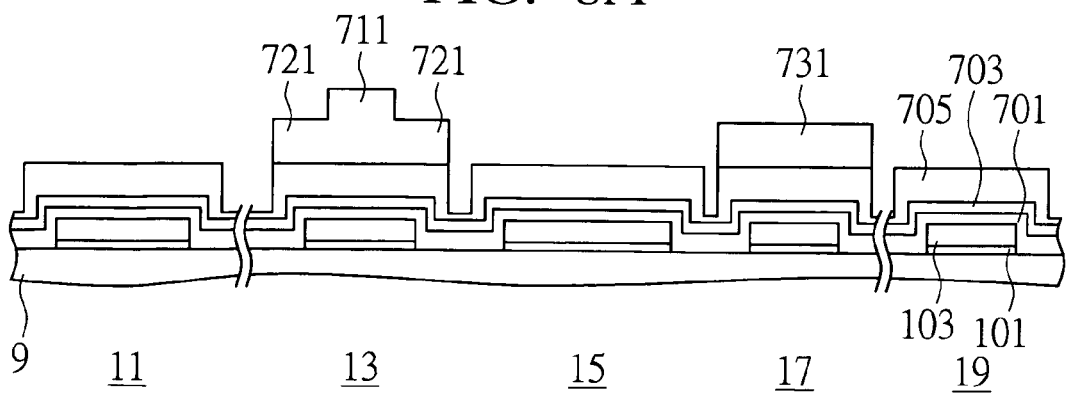
Figure 8C:
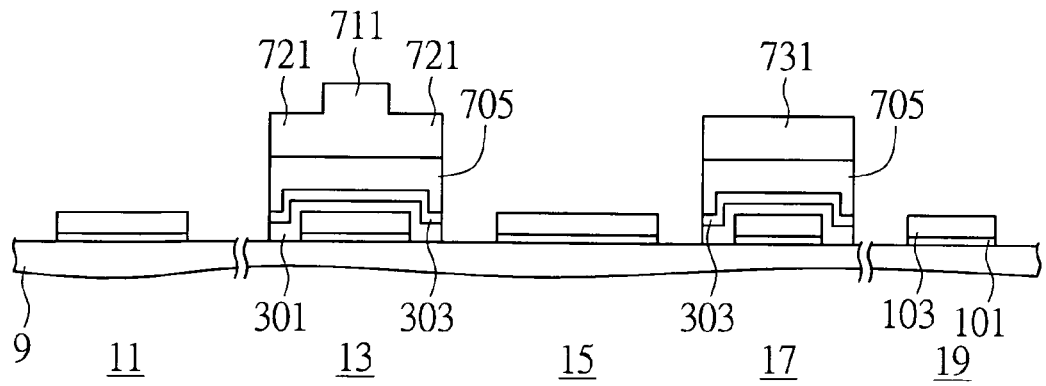
Figure 8D:
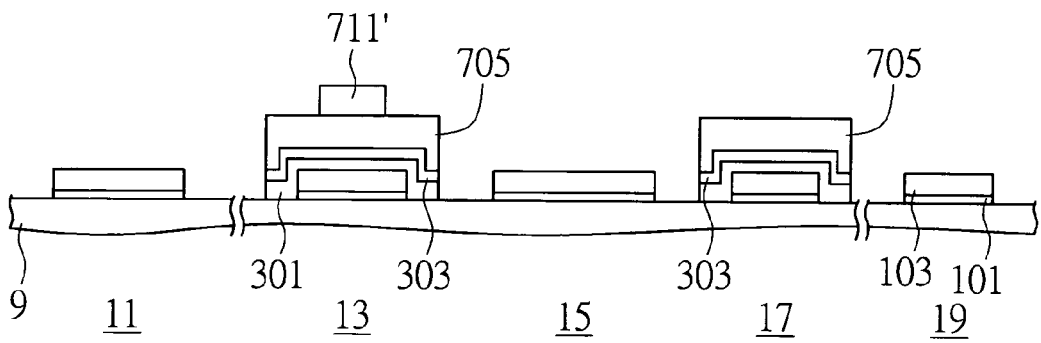
Figure 8E:
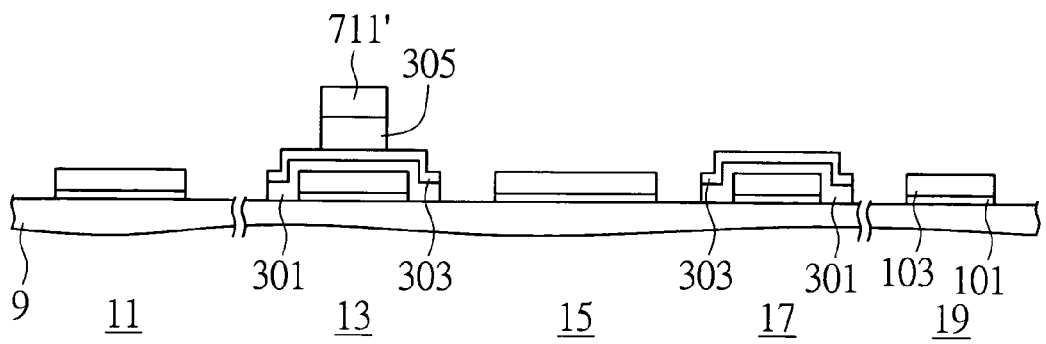

Additionally, in the second photomask process of the third embodiment, the structure within the TFT region and the capacitor region of FIG. 6B can be formed according to the manufacturing method as indicated in FIG. 8A~FIG. 8E. As indicated in FIG. 8A, a first insulating layer 701, a semiconductor layer 703 and a second insulating layer 705 are orderly formed above the substrate 9. Then, a patterned photoresist is respectively formed within the TFT region 13 and the capacitor region 17 as shown in FIG. 8B, wherein the patterned photoresist within the TFT region 13 comprises a first photoresist block 711 and a second photoresist block 721 which is disposed at two sides of the first photoresist block 711, and the thickness of the first photoresist block 711 is larger than that of the second photoresist block 721. The capacitor region 17 comprises a photoresist block 731, and the thickness of the first photoresist block 711 is also larger than that of the photoresist block 731. After that, the photoresist is used as a photomask, and a first etching process is applied to the second insulating layer 705, the semiconductor layer 703 and the first insulating layer 701 to form the patterned first insulating layer 301 and the patterned semiconductor layer 303 within the TFT region 13 and the capacitor region 17 as indicated in FIG. 8C. Then, the photoresist is thinned by ashing process until the second photoresist block 721 within the TFT region 13 is completely removed, as indicated in FIG. 8D. Meanwhile, the photoresist block 731 within the capacitor region 17 is completely removed. Afterwards, the remaining first photoresist block 711 is used as a photomask, and the second etching process is applied to the second insulating layer 705 to form a patterned second insulating layer 305 within the TFT region 13 as indicated in FIG. 8E. Meanwhile, the second insulating layer 705 within the capacitor region 17 is completely removed. Finally, the remaining photoresist block 711' is removed, and the structure within the TFT region and the capacitor region as indicated in FIG. 6B is completed. However, anyone who is skilled in the technology of the present invention will understand that the manufacturing method disclosed in FIG. 8A~FIG. 8E is only an example of one of the second photomask processes of the third embodiment, and those illustration disclosed herein is used for exemplify not limited the present invention. Other methods capable of manufacturing the structure within the TFT region and the capacitor region as indicated in FIG. 6B are also applicable to the third embodiment.

While the invention includes been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A display device, comprising:
a substrate having a TFT region, a pixel region, a capacitor region, a gate-line region and a data-line region;
a conductive stack layer disposed within each of the TFT/capacitor/gate-line regions of the substrate, wherein the conductive stack layer comprises a transparent conductive layer and a first metal layer;
a patterned first insulating layer disposed above the conductive stack layer within the TFT region and the capacitor region of the substrate;
a patterned semiconductor layer disposed above the patterned first insulating layer within the TFT region of the substrate;
a patterned second metal layer comprising a source/drain pattern, a second metal capacitor pattern, a gate circuit pattern and a data line, wherein the source/drain pattern is disposed above the patterned semiconductor layer within the TFT region, the second metal capacitor pattern is disposed above the patterned first insulating layer within the capacitor region, the gate circuit pattern physically contacts with the conductive stack layer in the gate-line region, and the conductive stack layer and the gate circuit pattern form a gate line, and the data line is disposed in the data-line region and electrically connected to the source pattern, and part of the transparent conductive layer in the pixel region is exposed as a pixel electrode; and
a photoresist layer covering the patterned second metal layer, wherein the photoresist layer is an organic material.

2. The display device according to claim 1, wherein the patterned semiconductor layer is disposed between the patterned first insulating layer and the second metal capacitor pattern within the capacitor region.

3. The display device according to claim 1, further comprising a patterned Ohmic contact layer disposed on the surface of the patterned semiconductor layer.

4. The display device according to claim 1, wherein each end of the gate-line region and the data-line region comprises part of the transparent conductive layer used as a pad.

5. The display device according to claim 1, further comprising a patterned second insulating layer disposed above the patterned semiconductor layer within the TFT region.

6. The display device according to claim 1, wherein the patterned first insulating layer is made of silicon dioxide, silicon nitride or an organic material.

7. The display device according to claim 1, wherein the transparent conductive layer is an indium tin oxide (ITO) layer or an indium zinc oxide (IZO) layer.

8. A display device, comprising:
a substrate having a TFT region, a pixel region, a capacitor region, a gate-line region and a data-line region;
a conductive stack layer disposed within the TFT region, the capacitor region and the gate-line region, wherein the conductive stack layer comprises a transparent conductive layer and a first metal layer;
a patterned first insulating layer disposed above the conductive stack layer within the TFT region and the capacitor region of the substrate;
a patterned semiconductor layer disposed above the patterned first insulating layer within the TFT region of the substrate;
a patterned second metal layer comprising a source/drain pattern, a second metal capacitor pattern, a gate circuit pattern and a data line, wherein the source/drain pattern is disposed above the patterned semiconductor layer within the TFT region, the second metal capacitor pattern is disposed above the patterned first insulating layer within the capacitor region, the gate circuit pattern physically contacts with the conductive stack layer in the gate-line region and the conductive stack layer in the gate-line region and the gate circuit pattern form a gate line, and the data line is disposed in the data-line region and electrically connected to the source pattern;
a pixel electrode is disposed in the pixel region on the substrate, wherein the pixel electrode layer is made of an transparent conductive material and electrically connected to the source/drain pattern; and
a photoresist layer covering the patterned second metal layer and exposing the pixel electrode, wherein the photoresist layer is made of an organic material.

9. The display device according to claim 8, wherein the patterned semiconductor layer is disposed between the patterned first insulating layer and the second metal capacitor pattern within the capacitor region.

10. The display device according to claim 8, further comprising a patterned Ohmic contact layer disposed on the surface of the patterned semiconductor layer.

11. The display device according to claim 8, further comprising a gate pad disposed in the end of the gate-line region, and a data pad disposed in the end of the data-line region.

12. The display device according to claim 8, further comprising a patterned second insulating layer disposed above the patterned semiconductor layer within the TFT region.

13. The display device according to claim 8, wherein the patterned first insulating layer is made of silicon dioxide, silicon nitride or an organic material.

14. The display device according to claim 8, wherein the transparent conductive layer is an indium tin oxide (ITO) layer or an indium zinc oxide (IZO) layer.

* * * * *